(12) United States Patent
D'Souza et al.

(10) Patent No.: US 12,183,408 B2
(45) Date of Patent: Dec. 31, 2024

(54) OPERATING A MEMORY UNIT USING A LOW-POWER DIRECT-CURRENT (DC) POWER SOURCE

(71) Applicant: Ningbo Aura Semiconductor Co., Limited, Ningbo (CN)

(72) Inventors: Arnold J D'Souza, Bangalore (IN); Shyam Somayajula, Bangalore (IN)

(73) Assignee: Ningbo Aura Semiconductor Co., Ltd., Zhejiang (CN)

( * ) Notice: Subject to any disclaimer, the term of this patent is extended or adjusted under 35 U.S.C. 154(b) by 340 days.

(21) Appl. No.: 17/643,823

(22) Filed: Dec. 11, 2021

(65) Prior Publication Data

US 2022/0351792 A1 Nov. 3, 2022

(30) Foreign Application Priority Data

May 3, 2021 (IN) .............................. 202141020222

(51) Int. Cl.
  *G11C 17/18* (2006.01)
  *G11C 17/16* (2006.01)
  (Continued)

(52) U.S. Cl.
  CPC .............. *G11C 17/18* (2013.01); *G11C 17/16* (2013.01); *H02M 1/0045* (2021.05); *H02M 3/07* (2013.01); *H04B 1/40* (2013.01); *H01Q 1/246* (2013.01)

(58) Field of Classification Search
  CPC ....... G11C 7/08; G11C 7/065; G11C 11/4091; G11C 16/30; G11C 11/4094; G11C 11/565; G11C 5/147; G11C 7/14; G11C 11/419; G11C 11/404; G11C 11/405; G11C 16/26; G11C 5/063; G11C 13/004; G11C 17/18; G11C 7/12; G11C 11/4045; G11C 11/4096; G11C 17/16; G11C 2207/2254;
  (Continued)

(56) References Cited

U.S. PATENT DOCUMENTS 8,054,125 B2 11/2011 Nervegna
8,122,307 B1 2/2012 Lindhorst et al.
(Continued)

FOREIGN PATENT DOCUMENTS

CN 106340322 A 1/2017
KR 101210286 B1 12/2012
WO WO2007017692 A 2/2007

OTHER PUBLICATIONS

Nilesh Badodekar, Power Saving with Cypress's 65-nm Asynchronous PowerSnooze™ SRAM, Mar. 30, 2015, 8 Pages.
(Continued)

*Primary Examiner* — Golam Sorowar
(74) *Attorney, Agent, or Firm* — IPHORIZONS PLLC; Narendra Reddy Thappeta (57) ABSTRACT

Operating a memory unit using a low-power DC source. The low-power DC source provides lesser power than that required to operate the memory unit. In an embodiment, charge from the low-power source is stored on a charge storage device in a first time interval. The memory unit is operated using the charge storage device as a second power source in a second time interval. A portion of one of the first time interval and the second time interval does not overlap with the other one of the first time interval and the second time interval.

20 Claims, 5 Drawing Sheets

(51) Int. Cl.
*H01Q 1/24* (2006.01)
*H02M 1/00* (2007.01)
*H02M 3/07* (2006.01)
*H04B 1/40* (2015.01)

(58) Field of Classification Search
CPC .... G11C 7/18; G11C 8/16; G11C 5/14; G11C 11/5642; G11C 13/0038; H02M 3/07; H02M 1/08; H02M 1/0009; H02M 1/36; H02M 3/073; H02M 1/0025; H02M 1/0032; H02M 1/0045; H02M 1/007; H02M 3/33515; H02M 3/33546; H02M 1/32; H02M 3/156; H02M 1/0012; H02M 3/072; H02M 3/075; H02M 3/33553; H02M 7/06; H02M 3/158; H02M 3/15
See application file for complete search history.

(56) References Cited

U.S. PATENT DOCUMENTS

| | | | | |
|---|---|---|---|---|
| 8,400,813 | B2 | 3/2013 | Lee | |
| 9,449,655 | B1* | 9/2016 | Zonte | G11C 16/26 |
| 11,295,787 | B1* | 4/2022 | Gunther | G11C 5/147 |
| 11,335,416 | B1* | 5/2022 | Sforzin | G11C 16/30 |
| 2010/0188920 | A1* | 7/2010 | Futatsuyama | G11C 5/147 |
| | | | | 365/207 |
| 2020/0286574 | A1* | 9/2020 | Kunz | G05F 3/262 |
| 2021/0255654 | A1* | 8/2021 | Chan | G05F 1/575 |
| 2022/0246220 | A1* | 8/2022 | Sforzin | G11C 16/0483 |
| 2023/0131586 | A1* | 4/2023 | Pedersen | G06F 1/3296 |
| | | | | 713/320 |

OTHER PUBLICATIONS

Mark Looney, Power Cycling 101: Optimizing Energy Use in Advanced Sensor Products, Aug. 2010, 5 Pages.

Li Xian, Zhong Huicai, Jia Cheng and Li Xin, A 4-kbit low-cost antifuse one-time programmable memory macro for embedded applications, May 2014, 5 Pages, vol. 35, No. 5.

"LV8907UW Sensor-less Three-phase Brushless DC Motor Controller, with Gate Drivers, for Automotive", Jul. 2019, 45 Pages.

Chung-Cheng Chou, Zheng-Jun Lin, Chien-An Lai, Chin-I Su, Pei-Ling Tseng, Wei-Chi Chen, Wu-Chin Tsai, Wen-Ting Chu, Tong-Chern Ong, Harry Chuang, Yu-Der Chih, Tsung-Yung and Jonathan Chang, A 22nm 96KX144 RRAM macro with a self-tracking reference and a low ripple charge pump to achieve a configurable read window and a wide operating voltage range, Aug. 19, 2020, 02 Pages.

"STAR4000", StarIC Inc, doi: https://www.staric.ca/star4000, downloaded circa May 31, 2021, 03 Pages.

* cited by examiner

OPERATING A MEMORY UNIT USING A LOW-POWER DIRECT-CURRENT (DC) POWER SOURCE

PRIORITY CLAIM

The instant patent application is related to and claims priority from the co-pending provisional India patent application entitled, "Method to Read OTP/EFuse Memory from a Current Limited Power Supply", Serial No.: 202141020222, Filed: 3 May 2021, which is incorporated in its entirety herewith to the extent not inconsistent with the description herein.

BACKGROUND

Technical Field

Embodiments of the present disclosure relate generally to power supply circuits, and more specifically operating a memory unit using a low-power DC power source.

Related Art

Direct-Current (DC) power sources are often used as sources of power for electronic circuitry, as is well known in the relevant arts. Examples of DC power sources include conventional batteries, regulated or unregulated power supplies deriving power from alternating current (AC) or DC sources, etc.

The power supplied by DC power sources can be used for operating memory units. Operating a memory unit implies that the basic access operations such as read and/or write and/or program are successfully performed from/into the memory unit. At least for performing such operations, each memory unit is designed to operate at a specified power level (voltage and/or current magnitudes) for corresponding operations (read, write, program, etc.).

There are often environments in which a memory unit needs to be operated using a low-power DC power source. A low-power DC power source refers to a DC power source that either provides a voltage that is less than the minimum voltage required for operation of the memory unit, or has a maximum current limit that is less than the (maximum) current consumed by the memory unit during read/write/program accesses to the memory unit, or both (i.e., voltage and current less than that required for the memory unit).

Several aspects of the present disclosure are directed to operating a memory unit using a low-power direct-current (DC) power source.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present disclosure, a memory unit is operated using a low-power source. The low-power source provides lesser power than that required to operate the memory unit. Charge from the low-power source is stored on a charge storage device in a first time interval. The memory unit is operated using the charge storage device as a second power source in a second time interval. A portion of one of the first time interval and the second time interval does not overlap with the other one of the first time interval and the second time interval.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
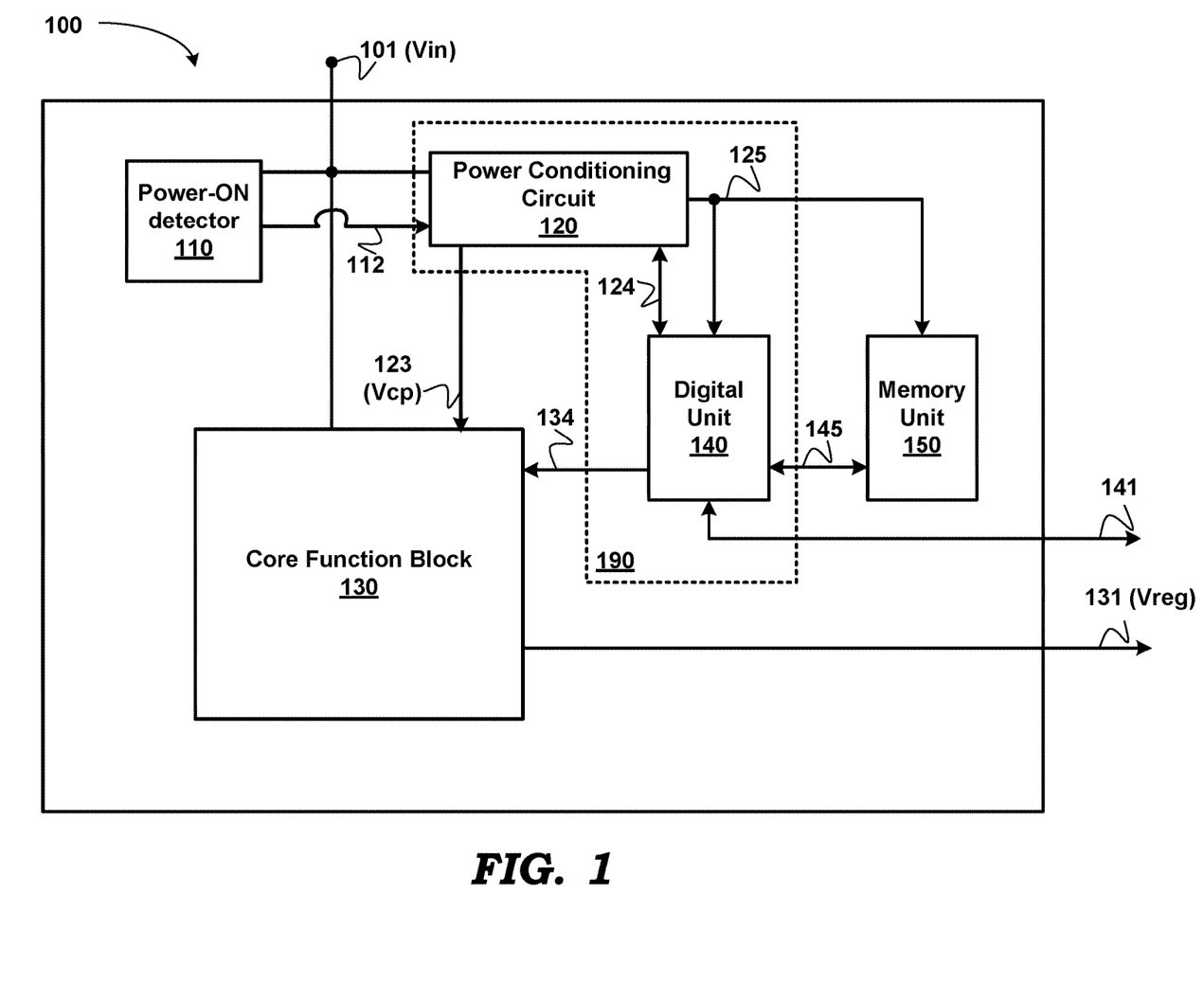
FIG. 1 is a block diagram of an example device in which several aspects of the present disclosure can be implemented.
Figure 4:
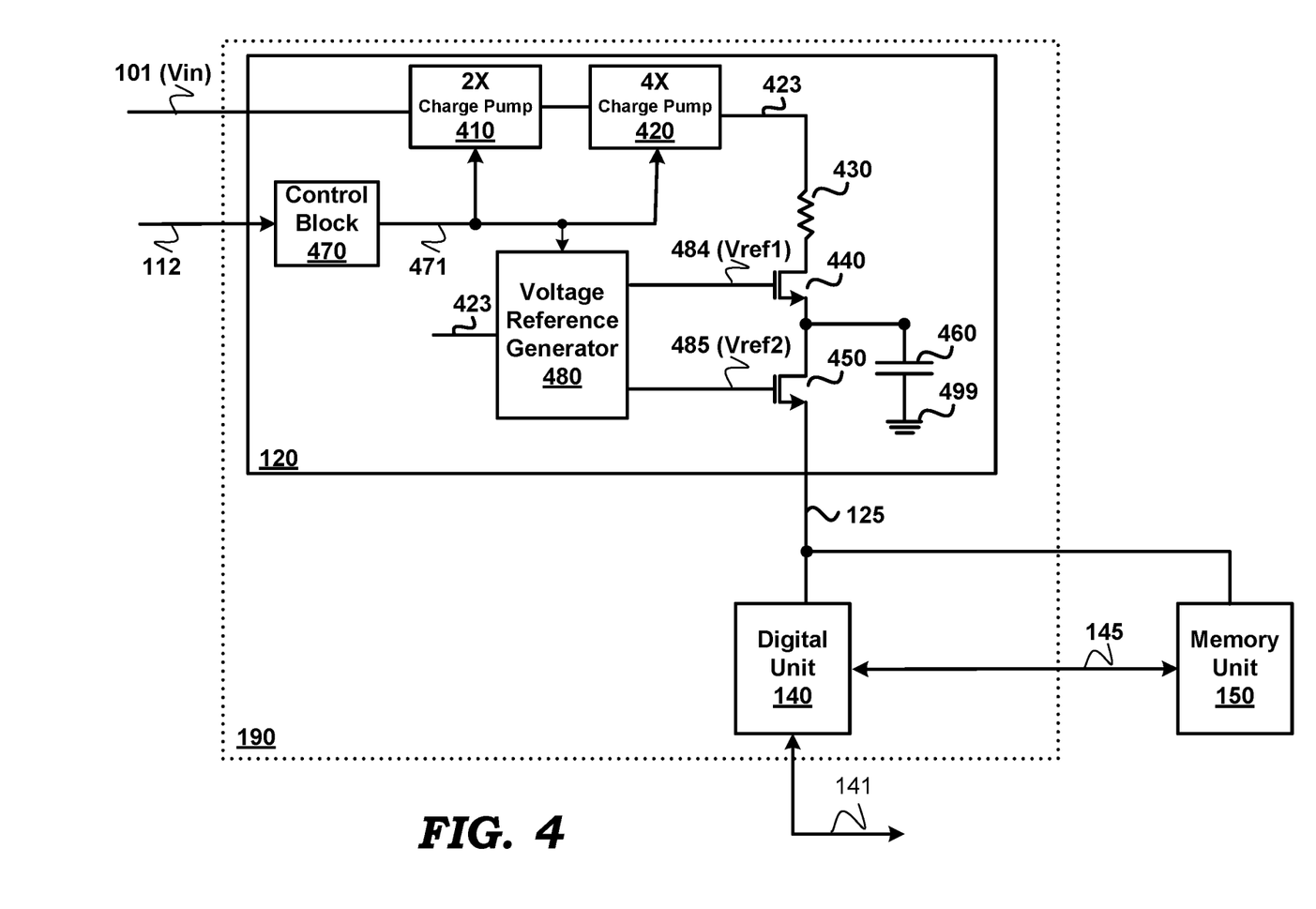
FIG. 4 is a diagram illustrating the implementation details of a data retrieval block designed to read from a memory unit using a low-power source, in an embodiment of the present disclosure.
Figure 6:
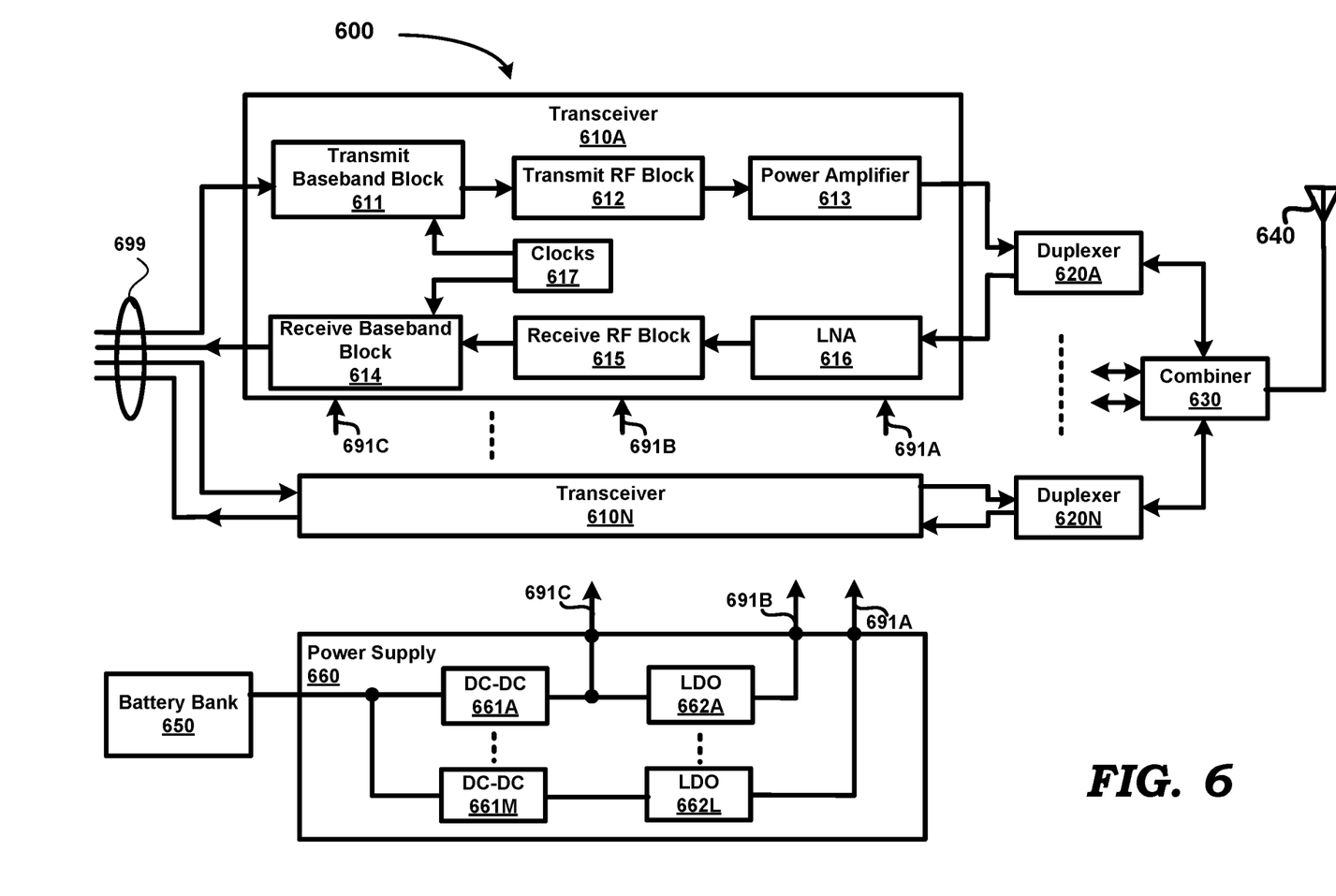
FIG. 6 is a block diagram of a system in which a device implemented according to several aspects of the present disclosure can be incorporated, in an embodiment of the present disclosure.

FIG. 1 is a block diagram of an example device in which several aspects of the present disclosure can be implemented. Device 100 is shown containing power-ON detector 110, power conditioning circuit 120, core function block 130, digital unit 140 and memory unit 150. Device 100 may be implemented in integrated circuit (IC) form partly or fully, or in discrete form. A low-power DC source (not shown) provides a voltage 101 (Vin) to device 100. In the example of FIGS. 1, 4 and 6, the low-power DC source is a low-voltage source, and voltage Vin (101) is less than the supply voltage needed to power memory unit 150 and operate memory unit 150 for reading and programming. However, it is to be noted that the techniques described herein can be applied in environments or devices which are powered by supplies having a maximum current limit that is less than the (maximum) current consumed by the memory unit (or load in general) during read/write/program accesses to the memory unit, or voltage and current less than that required for the memory unit, as also noted above.

Further, the description below is provided with respect to read operations from a one-time programmable (OTP) memory. However, the techniques described below can also be applied in contexts in which reading or writing to a volatile memory, or programming (multiple times) the contents of a non-volatile memory are required, when the memory unit has similar constraints as noted herein. Any modifications to the techniques described herein for such other contexts would be obvious to a skilled practitioner upon reading the disclosure provided herein.

Core function block 130 is designed to perform one or more desired operations to obtain desired functionality from device 100. As an example, core function block 130 may contain circuitry needed to implement a linear voltage regulator (including low-drop-out/LDO) or switching voltage regulator functionality in device 100, with device 100 then being the linear/LDO or switching voltage regulator. Core function block 130 may be designed to generate a regulated power supply voltage 131 (Vreg). Depending on the specific implementation of core function block 130, Vreg may be greater than, less than or equal to voltage Vin. To enable proper and desired operation of core function block 130, one or more circuits/portions within core function block 130 may be need to be configured first. For example, one or more 'trim bits' (configuration bits) for setting/initializing reference voltages, current limits, oscillator programming, etc., within core function block 130 may be needed for such configuration prior to normal operation of device 100. The trim bits typically close or open corresponding switches within core function block 130 to effect the configurations.

Power-ON detector block 110 generates a power-ON signal on path 112 in response to powering ON of device 100 from DC-source 101 (Vin). Signal 112 may be in the form of a pulse with appropriate pulse width. Power-ON detector block 110 provides the power-ON signal 112 to power conditioning circuit 120, and may be implemented in a known-way.

Memory unit 150 represents a non-volatile memory and stores data bits needed for configuring the one or more circuits/portions within core function block 130. Such configuration is typically performed only once, namely, upon power-up of device 100, although configuration after commencement of normal operation of core function block 130 can also be performed. Memory unit 150 may be implemented as any non-volatile memory types such as, for example, flash memory, EPROM (UV erasable programmable read-only memory), EEPROM (electrically erasable PROM), OTP (one-time programmable memory) and using technologies such as for example, eFUSE (electronic fuse) technology, gate-oxide breakdown anti-fuse technology, etc. In an embodiment of the present disclosure, memory unit 150 is an OTP memory. Memory unit 150 receives a supply voltage on path 125 from power conditioning circuit 120, which is described in detail in sections below.

Digital unit 140 is designed to read configuration data from memory unit 150 via path 145, and configure corresponding portions of core function block 130 via path 134 using the configuration data. The techniques described herein for reading memory unit 150 can also be applied to programming memory unit 150. Accordingly, digital unit 140 is shown as connected to path 141, on which digital unit 140 may receive configuration bits from an external device (not shown) and program the bits in memory unit 140. Digital unit 140 also receives supply voltage 125 from power conditioning circuit 120. However, in other embodiments, digital unit 140 may receive a different supply voltage, for example, form another charge pump (not shown).

Power conditioning circuit 120 receives input voltage Vin (101) from the low-power DC source, implying that the voltage is uni-directional. The low-power source may, for example, be a battery (not shown) or a DC power supply (regulated or unregulated, also not shown). Input voltage Vin has a magnitude less than the minimum voltage required for operation of memory unit 150. The term 'operation' or 'operating' of memory unit 150 is used herein to include reading from, writing to, and programming of memory unit 150. Additionally, or alternatively, the low power source providing Vin may have a maximum current limit that is less than the current consumed or required by memory unit 150 for operation. of memory. It is noted here that when on standby, i.e., merely powered-ON and not accessed, memory unit 150 may not require the large current otherwise needed for any of the operations noted above. Power conditioning circuit 120 receives power-ON signal 112, and commences operation to generate supply voltage 125.

Alternatively, while it may be possible to generate, from Vin, a voltage large enough for operation of memory unit 150 (and other blocks such as digital unit 140) by employing appropriate circuitry, it may not be possible to implement such circuitry to provide the current required by memory unit 150 for an operation, specifically read operation (with or without additionally having to provide current required for one or more other portions of device 100 such as digital unit 140), without also requiring larger component sizes and therefore without incurring an increased implementation area penalty.

According to an aspect of the present disclosure, the combination of power conditioning circuit 120 and digital unit 140 is designed to enable reading of data bits from memory unit 150 using a low-power source Vin. Additionally, power conditioning circuitry 120 may be implemented with minimal or no implementation area penalty than if the above-noted requirements, specifically current requirements, of memory unit 150 were not present.

Further, although the description herein is provided in the context of reading of configuration bits from an OTP memory for configuring the operation of a circuit such as a voltage regulator, several aspects of the present disclosure can be equally well applied in other contexts and environments in which similar constraints as noted above with respect to a low-power source are posed. Examples of such other environments include those requiring reading boot-code for a computing unit (implemented using core function block 130), reading encryption keys for a security device, etc., and would be obvious to one skilled in the relevant arts upon reading the disclosure herein.

The manner in which the combination of power conditioning circuit 120 and digital unit 140 is used for reading data bits from memory unit 150 is described below with respect to a flowchart. The combination of power conditioning circuit 120 and digital unit 140 is referred to herein as "data retriever block 190".

Several features of the present disclosure would be better understood and appreciated when compared with conventional techniques for reading from an OTP memory. Accordingly, an example prior technique is briefly illustrated next with respect to FIG. 2.

Figures 2, 3:
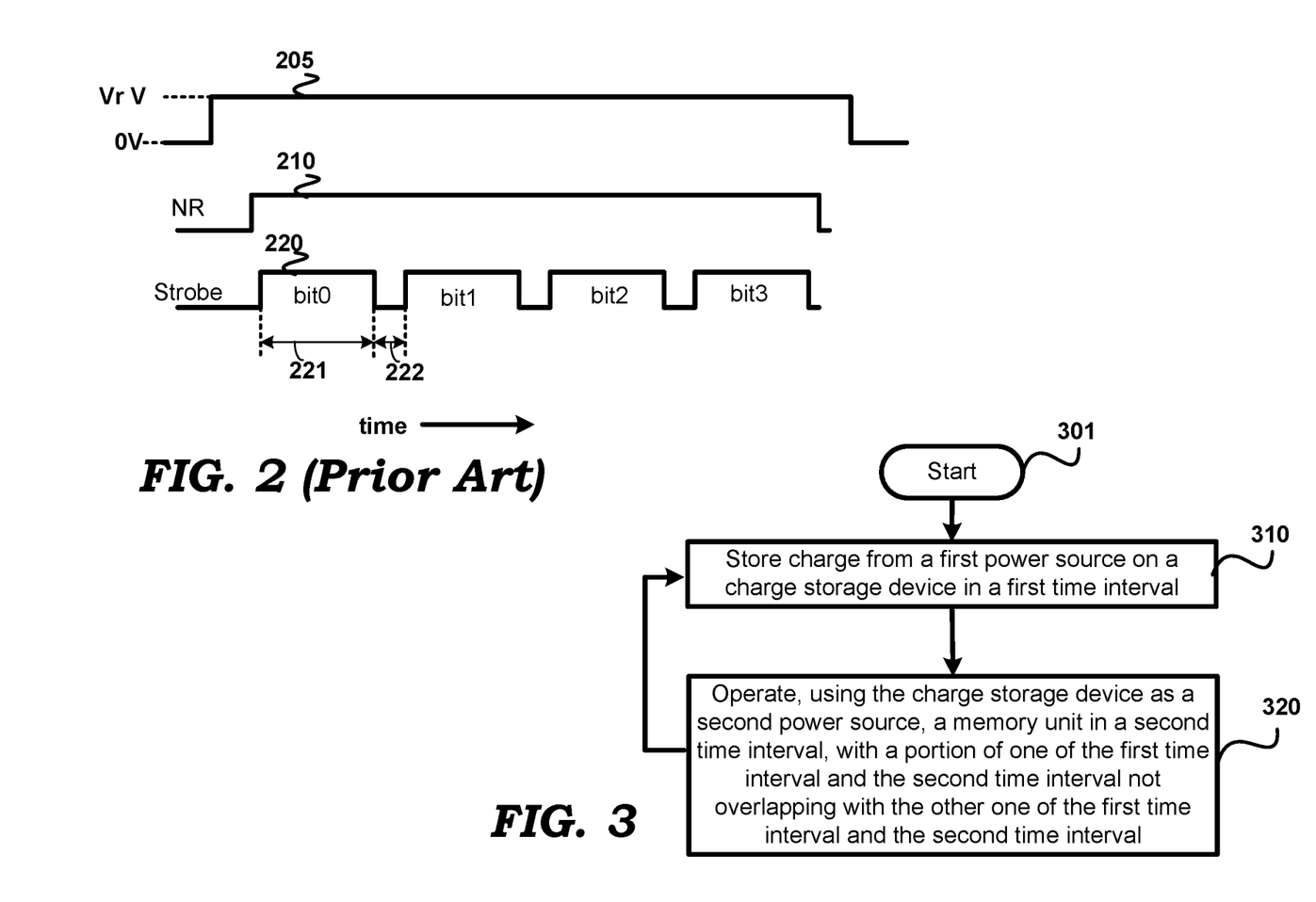
FIG. 2 is a timing diagram illustrating read operations from a memory unit according to a prior technique.
FIG. 3 is a flowchart illustrating the manner in which data is read from a memory unit using a low-power source, in an embodiment of the present disclosure.

FIG. 2 is a timing diagram of a prior/conventional technique for reading data from an OTP memory. Signals 210 (NR) and Strobe 220 respectively represent a read signal and a strobe signal used to read data from the OTP memory. Voltage 205 is generated by, or derived from, a high-power source, and is capable of providing the voltage as well as maximum read-current required for the OTP memory. Contents of address and data lines during OTP memory reads are not shown in FIG. 2 for conciseness. It is assumed in FIG. 2 that 4 data bits are to be read from the OTP memory.

Upon power-up, voltage 205 is generated with magnitude (Vr) volts having a magnitude as required for the OTP memory. NR 210 is a read signal and is asserted for the entire duration of reading of the 4 bits shown. Strobe 220 is asserted and de-asserted as indicated by example intervals 221 and 222. When asserted (e.g., interval 221), data (assumed to be one-bit wide) is read. Strobe 220 is de-asserted for a shorter duration (e.g., interval 222) prior to a next read. Bits 0, 1, 2 and 3 are shown as being read in succession. The data line of the OTP memory is pulled up when strobe is asserted (logic high in FIG. 2). When the value of a bit read from the OTP memory is a 0 (e.g., fuse at that bit-location is not burned), the corresponding read current can be as high as 200 micro-Amperes (uA). When the value of a bit read from the OTP memory is a 1 (e.g., fuse at that bit-location has been burned), the corresponding read current can be 50 uA. To minimize the total time required to complete reading all bits, the de-assert interval of strobe 220 between two reads may only be as long as the minimum value required by the specifications of the OTP memory, and may be much smaller than the assert interval in which data is read. In other words, data is read substantially 'continuously' from the OTP memory until all the 4 bits are retrieved.

As noted above, there are several environments (such as that of FIG. 1) in which a power source capable of providing the voltage and/or current for reading the OTP memory is not available. In the example of FIG. 1, Vin (101) may be as low as 1.1 volts (V), memory unit 150 requires a 1.8V supply voltage and up to 200 micro-Amperes (uA) of current for reliable read operations. While a charge pump can be implemented to generate a higher voltage from Vin (e.g., 2.2V (2×) or 3.3V (3×) from which the constant 1.8V can be derived), it would need to supply at least 200 uA continuously at least until all the configuration bits from memory unit 150 are read. Such requirements may translate to unacceptably large implementation area for the charge pump, which may not be desirable, especially when the OTP memory typically needs to be read just once, i.e., upon power-up of device 100. Furthermore, when other blocks of device 100, such as digital unit 140, also need to operate from a higher voltage than Vin, the current requirements of the charge pump are further increased (e.g., to 300uA continuous), which translate to further increase in the implementation area, which may not be desirable.

Aspects of the present disclosure enable a memory unit to be read using a low-power source, while not suffering from the drawbacks noted above, as described next.

3. Reading from Memory Using a Low-Power Source

FIG. 3 is a flowchart illustrating the manner in which a data retriever block reads data from a memory using a low-power source. The flowchart is described with respect to FIG. 1, and in relation data retrieval block 190, merely for illustration. However, various features can be implemented in other environments and using other components. Furthermore, the steps are described in a specific sequence merely for illustration. Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, data retrieval block 190 stores charge from a first power source on a charge storage device in a first time interval. The first power source is a low-power DC source. Control then passes to step 320.

In step 320, data retrieval block 190 operates, using the charge storage device as a second power source, a memory unit in a second time interval. A portion of one of the first time interval and the second time interval does not overlap with the other one of the first time interval and the second time interval. In other words, the time intervals do not overlap completely on a time scale.

Control then passes back to step 310, in which data retrieval block 190 again stores charge from the first power source on the charge storage device, and the rest of the steps may be repeated, and other data bits may be read.

Due to the at least partial non-overlap between the first interval and the second interval, data retrieval block 190 is able to read memory unit 150 from the low-power DC source.

The operations of the steps described above are illustrated next with respect to an example implementation of data retrieval block 190.

4. Data Retrieval Block

FIG. 4 is a diagram illustrating the implementation details of data retrieval block 190 in an embodiment of the present disclosure. Memory unit 150 of FIG. 1 is also shown for ease of reference. Power conditioning circuit 120 and digital unit 140 of data retrieval block 190 are shown in greater detail in FIG. 4. The internal details of digital unit 140 are not shown, as it can be implemented in a known way. Power conditioning circuit 120 is shown containing charge pumps 410 and 420, resistor 430, N-type Metal Oxide Semiconductor transistor (NMOS) 440, NMOS 450, charge storage device 460, control block 470 and voltage reference generator 480.

Control block 470 receives power-ON signal 112, and signals charge pumps 410 and 420 as well as voltage reference generator 480 via path 471 to commence operation.

Each of charge pumps 410 and 420 represents a voltage multiplier circuit. The combination of charge pumps 410 and 420 operates to store charge from the low-power DC source providing Vin on capacitor 460, as further described below. In the embodiment of FIG. 4, two charge pumps 410 and 420 are used. Charge pump 410 is a 2× (2 times) voltage multiplier, whose output is provided to charge pump 420. Charge pump 420 is a 4× (4 times) voltage multiplier, whose output is provided on path 423. Vin (101) is provided as an input to charge pump 410. The charge pumps together generate a voltage on path 423 that has a magnitude eight times (8×) that of Vin. Although not shown for conciseness, control block 470 may generate one or more clock signals that may operate switches within each of the charge pumps to cause capacitors in the charge pumps to be operated to perform the voltage multiplication in a known way.

Thus, the combination of the two charge pumps operates to 'magnify' (i.e., multiply voltage) Vin to generate a 'higher voltage' on path 423. The magnitude of voltage 423 is at least equal to (or at least slightly larger than) the supply voltage (125) required for memory unit 150. However, a larger voltage than supply voltage 125 simplifies the design of the charge pumps 410 and 420, while speeding-up the reading of the desired data bits from memory unit 150. In general, larger the value of voltage 423, higher the value of operating current (needed by memory unit 150) that can be provided, shorter would be the total time needed to read the desired number of data bits from memory unit 150, and smaller would be the required sizes of capacitors and/or switches in the charge pumps, as further described below with respect to FIG. 5. In the example of FIG. 4, voltage 423 is supplied to digital unit 140 in addition to memory unit 150. The magnitude of voltage 423 is limited only by the maximum safe voltage that can be applied across charge storage device 460.

The use of two charge pumps with voltage multiplication factors as noted above is merely for illustration. A single charge pump can be used instead of two charge pumps, and can be implemented to have other voltage multiplication factors, integer or fractional, including a factor of 1. When no voltage magnification is needed (i.e., Vin is already greater than or equal to the supply voltage needed by memory unit 150), the charge pump can employ a multiplication factor of 1, merely transferring charge to capacitor 460. Control block 470 may be implemented to enable the multiplication factor to be selected, although the details are not shown as these would be obvious to one skilled in the relevant arts.

Node 423 is connected through resistor 430 to the drain terminal of NMOS 440. The source terminal of NMOS 440 is connected to drain terminal of NMOS 450, as indicated in FIG. 4. Resistor 430 has a resistance value chosen to limit the charging current that charges charge storage device 460. It is noted here that other circuits/blocks (not shown) may be present in device 100 that may operate directly from voltage 423. Therefore, drawing of a large current capacitor 460 would cause a large dip in voltage 423, which may affect such other circuits. Charge storage device 460 is connected between the junction of the source terminal of NMOS 440 and the drain terminal of NMOS 450, and ground 499. Charge storage device 460 can be implemented as a capacitor or a super-capacitor/ultra-capacitor, and using any of several technologies available for implementing a charge storage device. In the embodiment of FIG. 4, charge storage device 460 is a capacitor. The source terminal of NMOS 450 provides supply voltage 125, which is connected to the supply terminals of each of memory unit 150 and digital unit 140.

The gate terminals of each of NMOS 440 and NMOS 450 are connected to outputs of voltage reference generator 480. Voltage reference generator 480 receives voltage 423 and signal 471 as inputs. In response to signal 471 being asserted at power-ON, voltage reference generator 480 generates reference voltages Vref1 (484) and Vref2 (485) respectively having values based on the maximum safe voltage that can be applied on capacitor 460 (without damage), and the required magnitude of supply voltage 125. In the example embodiment of FIG. 4, the maximum safe voltage is 5.5V. However, such safe voltage can be greater or smaller than 5.5V depending on the technology used for implementing capacitor 460. Specifically, Vref1 has a value equal to the sum of Vt1 (threshold voltage of NMOS 440) and the maximum safe voltage that capacitor 460 can be charged to in a charge cycle. Vref2 has a value equal to the sum of Vt2 (threshold voltage of NMOS 450) and the magnitude of supply voltage 125. The lowest voltage that capacitor 460 can be discharged to in a discharge phase can be greater than or equal to the desired supply voltage 125. Charge and discharge phases of capacitor 460 are illustrated further below. A charge phase corresponds to the first interval noted above with respect to FIG. 3, while a discharge phase corresponds to the second interval noted there.

In the example of FIG. 4, Vin is 1.1 V, and therefore voltage 423 is 8.8 V. Supply voltage 125 required by memory unit 150 is 1.8V. In the example of FIG. 4, digital unit 140 also requires a supply voltage of 1.8V. The maximum voltage that capacitor 460 is charged to in a charge phase equals 5.5V. The lowest voltage that capacitor 460 is discharged to in a discharge phase equals the supply voltage 125 of 1.8V. Correspondingly, Vref1 equals 5.5V+Vt1, and Vref2 equals 1.8V+Vt2, thereby maintaining supply voltage 125 at a constant 1.8V, as required. It is noted here that, although voltage 145 is noted above a equaling 8.8V, there may be some voltage drop (1 or 2 volts) voltage 125 if there are other circuits/blocks (not shown) that are powered by voltage 125. However, such voltage drop is acceptable in the context of FIGS. 1, 4 and 6, since capacitor 460 is required to be charged only to 5.5V. The operation of data retrieval block 190 shown in FIG. 4 is described next with combined reference to FIGS. 4 and 5.

Figure 5:
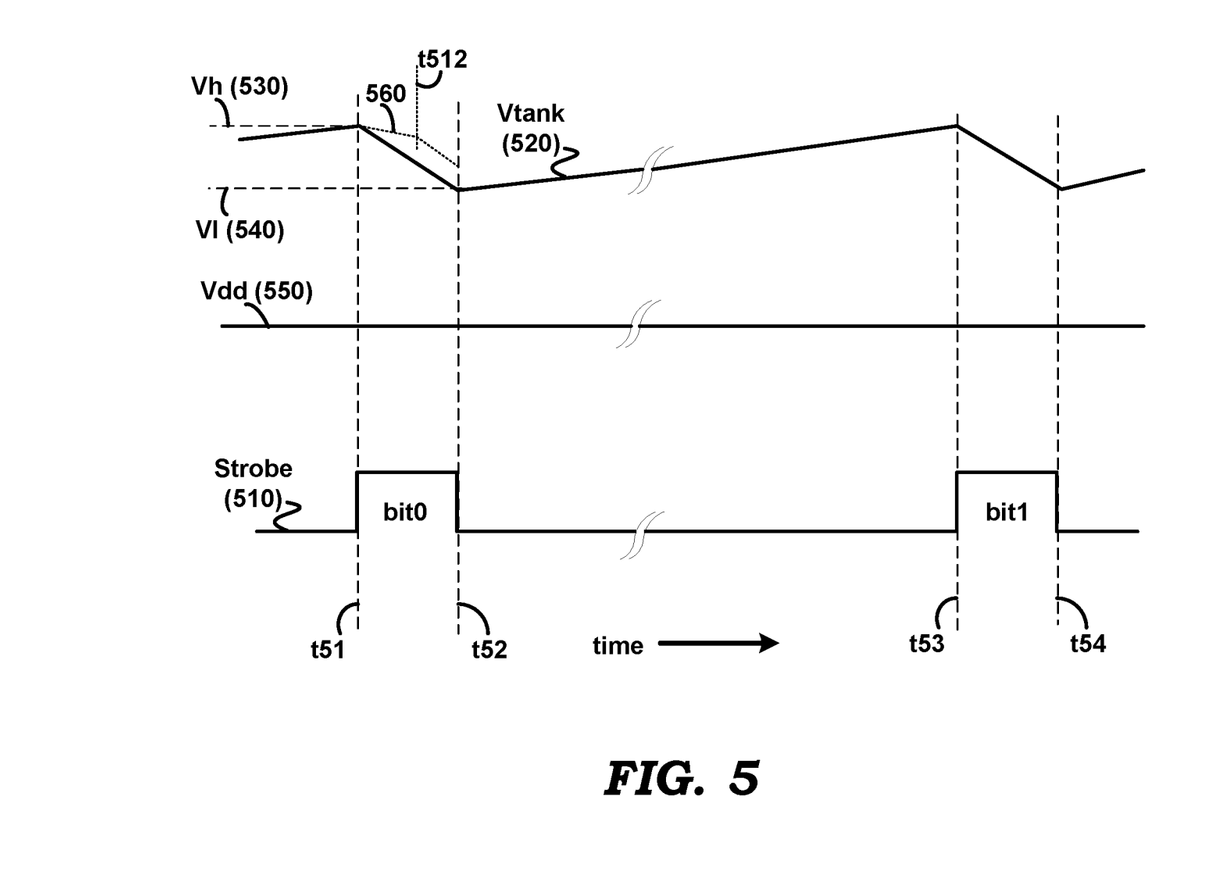
FIG. 5 is a diagram illustrating read operations from a memory unit, in an embodiment of the present disclosure.

FIG. 5 is a timing diagram illustrating the operation of data retrieval block 190, in which reading by digital unit 140 of two data bits, bit0 and bit1, are shown. However, the same operation is employed for reading all the configuration bits in memory unit 150. Vh (530) and Vl (540) respectively represent the maximum voltage that capacitor 460 is charged to in a charge phase, and the lowest voltage that capacitor 460 is discharged to in a discharge phase. Vtank (520) represents the voltage across capacitor 460. Vdd (550) represents the desired value of supply voltage 125, and equals Vl (540) in the example, although shown separately for clarity. However, in general, Vl (540) can be greater than or equal to voltage 125. Time interval t51-t52 represents a discharge phase of capacitor 460, and time interval t52-t53 represents a charge phase. Time interval t53-t54 represents a next discharge phase. A read signal (NR) similar to NR 210 of FIG. 2 is not shown in FIG. 5, but may be in the asserted (e.g., logic high) state throughout the read operations from memory unit 150.

In FIG. 5, the first interval and the second interval noted above with respect to the flowchart of FIG. 3 are completely non-overlapping (duration t51-t52 does not overlap in time domain with duration t52-t53) and contiguous (i.e., second interval immediately follows the first interval without any gap or overlap between them). However, in another embodiment, there are gaps between these intervals. In the example of FIG. 5, in the first interval t52-t53, only magnification of Vin and charging of capacitor 460 occur, while in the second interval t53-t54, only memory read and discharge of capacitor 460 occur. Interval t52-t53 is another example of a 'second interval' that is preceded (not shown) by a corresponding second interval.

Power conditioning circuit 120 operates to charge capacitor 460 to Vh (530) in charge phases, and thus, charge pumps 410 and 420 are operational and generate a higher voltage on node 423. Digital unit 140 then reads one or more data bits (although only a single bit is indicated as being read in FIG. 5) in discharge phases, in which charge pumps 410 and 420 may be non-operation and thus be switched off (under control from control block 470). In discharge phase t51-t52, the voltage Vh or the corresponding charge on capacitor 460 by the end of the immediately preceding charge phase is used for supplying the read current required by memory unit 150 (as well as digital unit 140) in reading bit0. In the example, depending on whether bit0 is a logic high or logic low, a current of 50 uA or 200 uA respectively is drawn from capacitor 460 for reading a bit. Consequently, capacitor 460 is shown as discharging to Vl (540) by t52. At t52, a next charge phase commences and charges capacitor 460 to Vh (530) by t53. Duration t52-t53 is an idle duration in which memory unit 150 is idle or standby, i.e., not being accessed for reads. Memory unit 150 can also be switched off during the idle duration by control block 470 although such control is not indicated in FIG. 4. Interval t53-t54 is a next discharge interval, and digital unit 140 reads another bit (bit1). The charge and discharge intervals may repeat until digital unit 140 has read all data bits needed to configure core function block 130 (FIG. 1).

The required value of capacitance of capacitor 460 depends on several factors such as the difference between Vh and Vl, the maximum read current (200 uA in the example), how many bits are read in a discharge phase, magnitude of supply voltage 125, and the interval between two reads (t52-t53 in FIG. 5). In the example described, with Vh being 5.5V and supply voltage 125 being 1.8V, to supply a maximum of 200 uA read current for memory unit 150 for a read duration (e.g., t51-t52 or t53-t54 in FIG. 5) of 2 microseconds (μs) the minimum required value of capacitance is [200 uA*2 μs/(5.5−1.8)], i.e., approximately 108 picoFarads (pF). Assuming an additional current of 100 uA for other portions of device 100 (including digital unit 140) that need to be powered by supply voltage 125 (1.8V), the minimum required value of capacitance is approximately 162 pF. For the above value of capacitance, capacitor 460 can be implemented as a high density gate-oxide capacitor thereby needing only a small implementation area.

It may be appreciated from the description above that allowing sufficiently long intervals (e.g., t52-t53 in FIG. 5) between data reads, and replenishing the charge on capacitor 460 between the data reads by operating charge pumps 410 and 420, the average current that needs to be supplied by the charge pumps for reading from memory unit 150 is greatly reduced. This allows charge pumps 410 and 420 to be implemented using smaller-sized capacitors (e.g., using metal-insulator-metal (MIM) capacitor technology). In an embodiment, a read duty cycle (ratio of interval t53-t54 and interval t52-t54) of 10% is employed, and the charge pumps 410 and 420 together need to supply only 1/10 of the maximum read current (200 uA in the example), i.e., 20 uA on an average in the steady state, thereby simplifying the design and relaxing the current specifications of the charge pumps. In an embodiment, charge pumps 410 and 420 operate continuously or at least for the duration required to configure core function block 130. There is no need for synchronization between the start of a read interval (e.g., t51 and t53) and the end of a charge phase (e.g., t51 and t53) since the read intervals (e.g., t51-t52 and t53-t54) are sufficiently far apart in time so that the average load current drawn from the charge pumps is low enough to maintain supply voltage 125 at the required level of 1.8V. However, it is possible to reduce the interval between two read operations, thereby increasing the average current drawn from the charge pumps (and capacitor 460). In such a scenario, the start of a read interval can be synchronized with the end of a charge phase of capacitor 460 to ensure that voltage 125 does not fall below the required level during the read operation.

It is noted here that although the first interval and the second interval are completely non-overlapping and contiguous in the example of FIG. 5, the first interval and the second interval can, in general, be partially (but not completely) overlapping. Alternatively, a portion of one of the first time interval and the second time interval does not overlap with the other one of the first time interval and the second time interval. Thus, in an alternative embodiment, some portion of a charge phase of capacitor 460 can overlap with a discharge phase in which data is/are read from memory 150. In such an embodiment, the change in voltage Vtank (520) can have a different slope(s), as indicated by marker 560 in FIG. 5 for the duration of a bit read. Interval t51-t512 is an interval in which both charging and discharging of capacitor 460 occurs. The slope change at t512 indicates end of the charge phase. Interval t512-t52 represents an interval in which only discharge of capacitor 460 occurs. In yet another alternative embodiment, there can be a gap interval between a charge phase and a discharge phase.

Although the techniques described above are noted as being applied to data reads from a memory unit, substantially similar or identical techniques can be applied to writing to or reading from a volatile memory, or programming a non-volatile memory also. In such case, the read operations are replaced by write or program operations. Accordingly, digital unit 140 may interface with an external system to receive data on path 141, and write/program the received data in memory unit 150. The specific durations of the charge and discharge phases and the voltage levels of FIG. 5 may be different depending on the write/program specifications (including voltage and current).

Device 100 implemented as described above can be incorporated in a larger device or system as described briefly next.

5. Device/System

FIG. 6 is a block diagram illustrating the implementation details of a system incorporating device 100 implemented as a linear voltage regulator as described in detail above, in an embodiment of the present disclosure. The system of FIG. 6 may be deployed in a Base Transceiver Station (BTS) (eNodeB in LTE-Long Term Evolution) of a cellular telephony system, and is referred to herein as BTS system 600. Broadly, BTS system 600 facilitates wireless communication between user equipment (UE) that may be mobile stations (e.g., cell phones) or fixed user equipment such as computers with internet connectivity. BTS system 600 may be implemented consistent with technologies and standards such as GSM, CDMA, 3G, 4G, LTE, 5G, etc. BTS system 600 is shown containing transceivers 610A through 610N, duplexers 620A through 620N, combiner 630, antenna 640, battery pack 650 and power supply 660. The specific components/blocks of BTS system 600 are shown merely by way of illustration. However, typically BTS system 600 may contain more components/blocks, such as temperature sensors, maintenance and configuration blocks, etc., as is well-known in the relevant arts.

Each of transceivers 610A through 610N operates to transmit and receive communication signals to/from wireless user equipment via the corresponding duplexer 620A-620N, combiner 630 and antenna 640. Each of the transceivers contains a transmitter portion and a receiver portion. Thus, transceiver 610A is shown containing a transmitter portion that includes transmit baseband block 611, transmit RF block 612 and power amplifier 613, and a receiver portion that includes low-noise amplifier (LNA) 616, receive RF block 615 and receive baseband block 614.

Transmit baseband block 611 receives information signals (e.g., representing voice, data) from a base station controller (BSC) (which in turn receives the communication signals from another user equipment (wireless or fixed) in the network downstream of the BSC) via the corresponding path shown in bus 699, processes the signals according to the corresponding technology and protocols to perform modulation, channel coding and other operations, and forwards the processed signals to transmit RF block 612. Transmit RF block 612 may perform operations such as up-conversion to RF (Radio Frequency), and forwards the RF signals to power amplifier 613. Power amplifier 613 amplifies the received RF signals and transmits the power-amplified signals via duplexer 620A, combiner 630 and antenna 640 to corresponding wireless user equipment.

LNA 616 receives an RF signal from a wireless user equipment via duplexer 620A, combiner 630 and antenna 640, amplifies the RF signal, and forwards the amplified RF signal to receive RF block 615. Receive RF block 615 down-converts the RF signal to baseband frequency and forwards the baseband signal to receive baseband block 614. Receive baseband block 614 may perform operations such as demodulation, error correction, etc., on the baseband signals to obtain the information signal (e.g., data, voice) and forwards the information signal to BSC via the corresponding path in bus 699.

Clocks 617 generates one or more clocks required to enable operation of digital units in transceiver 610. For example, transmit baseband block 611 and receive baseband block 614 may internally contain one or more processors that require clocks to enable their operation.

The transmitters, receivers and clocks of the other transceivers of FIG. 6 operate similarly as noted above with respect to transceiver 610A, and contain corresponding transmitter and receiver blocks.

Each of duplexers 620A through 620N enables transmission and reception of the respective transmitted and received signal (i.e., bi-directional (duplex) communication) over the single path between the corresponding duplexer and combiner 630. Each of duplexers 620A through 620N may be implemented with two band-pass filters connected in parallel, with one filter providing a path between the corresponding transmitter and combiner 630, and the other filter providing a path between combiner 630 and the corresponding receiver.

Combiner 630 combines the signals from/to the transceivers 610A through 610N to enable transmission and reception of all the signals using a single antenna 640.

Antenna 640 operates to receive from, and transmit to, a wireless medium, information-bearing wireless signals between the transceivers and wireless user equipment.

Battery bank 650 houses batteries to provide a power source for the operation of the blocks/units in BTS system 600.

Power supply 660 receives power (for example with voltage 12 volts (V)) from battery bank 650, and contains multiple DC-DC converters 661A through 661M, as well as multiple linear voltage regulators (implemented for example as LDOs) 662A through 662L. DC-DC converters 661A-661M generate various voltages (with each DC-DC converter generating a corresponding voltage such as for example 0.7V, 1.2V, 2.0V, 3.6V, etc.) for powering one or more blocks/components of BTS system 600 described above. Specifically, the voltages generated by the DC-DC converters may be used to power blocks and components in transceivers 610A through 610N that are less sensitive to noise, such as for example the transmit and receive baseband blocks. Thus, supply voltage 691C is shown as being generated by DC-DC converter 661A, and being provided to (the transmit and receive baseband blocks) of transceiver 610. Supply voltage 691C may correspond to voltage 101 (Vin) of FIG. 1. In the interest of clarity and conciseness, only one supply connection directly from a DC-DC converter is shown in FIG. 6. However, there would be many more such supply connections.

Each of LDOs 662A-662L is connected to receive the output voltage of a corresponding DC-DC converter 661A-661M), and generates a corresponding lower voltage as needed for some components/blocks of the transceivers. Thus, LDO 662A may correspond to device/linear voltage regulator 100 of FIG. 1, with voltage 131 (Vreg) of FIG. 1 corresponding to voltage 691B. The voltages generated by the LDOs are used to power noise-sensitive blocks and components in transceivers 610A through 610N, such as for example transmit RF blocks (such as 612), receive RF blocks (such as 615), LNAs (such as 616) and the clocks (such as 617) contained in the transceivers. In the interest of clarity and conciseness, only two supply connections 691A and 691B (from LDO 662L and LDO 662A respectively) are shown in FIG. 6. However, there would be many more such supply connections from the LDOs to corresponding blocks in the transceivers. The LDOs may have better load and line regulation as compared to the DC-DC converters, and may thus provide cleaner supply voltages with lesser noise, as required by the noise-sensitive blocks noted above.

One or more of LDOs 662A-662-L is/are implemented as linear voltage regulator/device 100 described in detail above.

It is noted here that linear voltage regulator 100 can also be used in other systems, such as, for example, individual transmitters and receivers, mobile phones, etc.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4 and 6, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method performed associated with a memory unit, said method comprising:

storing charge from a first power source on a charge storage device in a first time interval, wherein said first power source provides lesser power than that required to operate said memory unit; and operating, using said charge storage device as a second power source, said memory unit in a second time interval, wherein a portion of one of said first time interval and said second time interval does not overlap with the other one of said first time interval and said second time interval, reading, from said memory unit, a first bit in a first read duration and a second bit in a second read duration, wherein said first read duration is separated from said second read duration by an idle duration, wherein said idle duration comprises said first time interval, and said first read duration comprises said second time interval.

2. The method of claim 1, wherein said charge storage device is a capacitor, wherein said memory unit is designed to operate from a supply providing a first voltage, wherein a second voltage provided by said first power source is smaller than said first voltage, wherein said storing causes said second voltage to be magnified to provide a magnified voltage greater than or equal to said first voltage, wherein said storing causes said capacitor to be charged to said magnified voltage in said first time interval.

3. The method of claim 2, wherein said first time interval and said second time interval are completely non-overlapping, wherein said magnified voltage is greater than said first voltage, said method further comprising:

deriving said first voltage from said magnified voltage.

4. The method of claim 3, wherein said memory unit is a non-volatile one-time programmable (OTP) memory unit for storing configuration parameters, wherein said first bit and said second bit are comprised in said configuration parameters.

5. The method of claim 4, wherein said first time interval is longer than said second time interval.

6. The method of claim 5, wherein said magnified voltage represents the maximum safe voltage that said capacitor can be charged to.

7. The method of claim 6, wherein said configuration parameters are used for configuring one or more circuit blocks of a device, said method being performed in said device, wherein said device comprises:

said one or more circuit blocks to perform a desired operation;

said memory unit;

a digital unit comprising one or more circuits to perform said reading said first bit and said second bit;

a charge pump coupled to said first power source, said charge pump to perform said storing.

8. The method of claim 3, further comprising:

receiving one or more data bits; and programming respective locations in said memory unit with said one or more data bits also in said second time interval.

9. A device comprising:

a charge storage unit;

a charge pump, wherein an input of said charge pump is coupled to a first power source, an output node of said charge pump being coupled to said charge storage unit, wherein said first power source provides lesser power than that required to operate a memory unit, wherein said charge pump is designed to store charge from said first power source on said charge storage device in a first time interval, wherein said memory unit is operated in a second time interval using said charge storage device as a second power source, wherein a portion of one of said first time interval and said second time interval does not overlap with the other one of said first time interval and said second time interval; and a digital unit comprising one or more circuits to read, from said memory unit, a first bit in a first read duration and a second bit in a second read duration, wherein said first read duration is separated from said second read duration by an idle duration, wherein said idle duration comprises said first time interval, and said first read duration comprises said second time interval.

10. The device of claim 9, wherein said charge storage device is a capacitor, said device further comprising said memory unit, wherein said memory unit is designed to operate from a supply providing a first voltage, wherein a second voltage provided by said first power source is smaller than said first voltage, wherein said charge pump is designed to magnify said second voltage to a magnified voltage during storing of said charge on said capacitor to cause said capacitor to be charged to said magnified voltage in said first time interval, wherein said magnified voltage is greater than or equal to said first voltage.

11. The device of claim 10, wherein said memory unit is operated in said second time interval using said charge storage device as said second power source.

12. The device of claim 11, wherein said first time interval and said second time interval are completely non-overlapping, wherein said magnified voltage is greater than said first voltage, said device further comprising:

a resistor and a first transistor coupled in series between said output node and an internal node of said device, wherein said capacitor is coupled between said internal node and a first constant reference potential; and a second transistor coupled between said internal node and a power supply terminal of said memory unit.

13. The device of claim 12, wherein a first terminal of said resistor is coupled to output node, wherein a first current terminal of said first transistor is coupled to a second terminal of said resistor, wherein a second current terminal of said first transistor is coupled to said internal node, and wherein a control terminal of said first transistor is coupled to a first reference voltage having a magnitude equal to the sum of a threshold voltage of said first transistor and the maximum voltage that said capacitor is to be charged to.

14. The device of claim 13, wherein a first current terminal of said second transistor is coupled to said internal node, wherein a second current terminal of said second transistor is coupled to said power supply terminal of said memory unit, wherein a control terminal of said second transistor is coupled to a second reference voltage having a magnitude equal to the sum of said magnitude of said first voltage and a threshold voltage of said second transistor.

15. The device of claim 14, further comprising a voltage reference generator to generate said first reference voltage and said second reference voltage.

16. The device of claim 15, further comprising a core function block, said core function block comprising circuitry for implementing a low-dropout regulator (LDO), said LDO for generation of a regulated power supply voltage from said low-power source, said regulated power supply voltage being an output of said device.

17. A system comprising:
a power terminal coupled to a first power source; and
a power supply unit coupled to receive power from said power terminal, said power supply unit comprising a first linear voltage regulator and a first DC-DC converter, said first DC-DC converter representing a third power source coupled to said power terminal, said first linear voltage regulator coupled to said third power source to generate a first lower supply voltage,
wherein said first linear voltage regulator comprises:
a core function block, said core function block comprising circuitry for generation of said first lower supply voltage;
a charge storage unit;
a charge pump, wherein an input of said charge pump is coupled to said third power source, an output node of said charge pump being coupled to said charge storage unit,
wherein said third power source provides lesser power than that required to operate a memory unit,
wherein said charge pump is designed to store charge from said power terminal on said charge storage device in a first time interval,
wherein said memory unit is operated in a second time interval using said charge storage device as a second power source,
wherein a portion of one of said first time interval and said second time interval does not overlap with the other one of said first time interval and said second time interval; and
a digital unit comprising one or more circuits to read, from said memory unit, a first bit in a first read duration and a second bit in a second read duration, wherein said first read duration is separated from said second read duration by an idle duration,
wherein said idle duration comprises said first time interval, and said first read duration comprises said second time interval.

18. The system of claim 17, further comprising:
an antenna;
a first duplexer coupled to said antenna; and
a first transceiver, wherein said first lower supply voltage is used to power a noise-sensitive block in said first transceiver,
said first transceiver comprising a transmitter portion and a receiver portion each coupled to said first duplexer, said first transceiver to transmit communication signals to a wireless medium via said first duplexer and said antenna, said first transceiver to also receive communication signals from said wireless medium via said first duplexer and said antenna,
wherein said charge storage device is a capacitor, said first linear voltage regulator further comprising said memory unit,
wherein said memory unit is designed to operate from a supply providing a first voltage,
wherein a second voltage provided by said third power source is smaller than said first voltage,
wherein said charge pump is designed to magnify said second voltage to a magnified voltage during storing of said charge on said capacitor to cause said capacitor to be charged to said magnified voltage in said first time interval, wherein said magnified voltage is greater than or equal to said first voltage.

19. The system of claim 18, wherein said system is a base transceiver station (BTS) system, said BTS system further comprising:
a combiner coupled to said antenna;
a plurality of duplexers, each coupled to said combiner, said plurality of duplexers including said first duplexer; and
a plurality of transceivers including said first transceiver, each of said plurality of transceivers comprising a transmitter portion and a receiver portion coupled to a corresponding one of said plurality of duplexers at one end and a base station controller (BSC) at the other end, wherein each of said plurality of transceivers is designed to transmit into said wireless medium information signals received from said BSC via the corresponding one of said plurality of duplexers, said combiner and said antenna, as well as to forward information signals received from said wireless medium via the corresponding one of said plurality of duplexers, said combiner and said antenna to said BSC;
wherein said power supply unit comprises:
a plurality of DC-DC converters coupled to receive said power from said power terminal and to generate respective supply voltages including said second voltage, said plurality of DC-DC converters including said first DC-DC converter, wherein said second voltage is used to power a relatively noise-insensitive block in said first transceiver, wherein said first linear voltage regulator is coupled to receive said second voltage from said first DC-DC converter to generate said first lower supply voltage; and
a plurality of linear voltage regulators coupled to receive a supply voltage from a corresponding one of said DC-DC converters and to generate a corresponding lower supply voltage, wherein said plurality of linear voltage regulators includes said first linear voltage regulator,
wherein supply voltages generated by one or more of said DC-DC converters are used to power relatively noise-insensitive blocks in said plurality of transceivers, and wherein supply voltages generated by one or more of said linear voltage regulators is used to power noise-sensitive blocks in said plurality of transceivers,
wherein at least a second linear regulator in said plurality of linear voltage regulators is implemented similar to said first linear voltage regulator.

20. The system of claim 18, wherein said memory unit is a non-volatile one-time programmable (OTP) memory unit for storing configuration parameters, wherein said first bit and said second bit are comprised in said configuration parameters, wherein said first time interval is longer than said second time interval, wherein said magnified voltage represents the maximum safe voltage that said capacitor can be charged to.

* * * * *